(12) United States Patent
Fan et al.

(10) Patent No.: US 11,356,110 B1
(45) Date of Patent: Jun. 7, 2022

(54) VOLTAGE-TO-TIME CONVERTER ARCHITECTURE FOR TIME-DOMAIN ANALOG-TO-DIGITAL CONVERTER

(71) Applicant: University of Electronic Science and Technology of China, Chengdu (CN)

(72) Inventors: Hua Fan, Chengdu (CN); Xiaohu Qi, Chengdu (CN); Qianqian Deng, Chengdu (CN); Quanyuan Feng, Chengdu (CN); Shaoqing Lu, Chengdu (CN); Huaying Su, Chengdu (CN); Guosong Wang, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 0 days.

(21) Appl. No.: 17/328,716

(22) Filed: May 24, 2021

(30) Foreign Application Priority Data

Apr. 29, 2021   (CN) .......................... 202110472625.8

(51) Int. Cl.
*H03M 1/12*       (2006.01)
*H03M 1/06*       (2006.01)
*G04F 10/00*      (2006.01)

(52) U.S. Cl.
CPC .......... *H03M 1/068* (2013.01); *G04F 10/005* (2013.01)

(58) Field of Classification Search
CPC ....... H03M 7/42; H03M 7/005; H03M 7/6011
USPC ........................................................ 341/155
See application file for complete search history.

(56) References Cited

U.S. PATENT DOCUMENTS

| 2003/0080889 | A1* | 5/2003 | Lee .................. | H03K 17/04106 341/144 |
| 2005/0128117 | A1* | 6/2005 | Koo ................. | H03K 17/04106 341/144 |
| 2006/0044169 | A1* | 3/2006 | Matsumoto ......... | H03M 1/0604 341/144 |
| 2008/0284634 | A1* | 11/2008 | Ito ...................... | H03F 3/45179 341/157 |

(Continued)

OTHER PUBLICATIONS

Narmin Samimian et al.; "A Time-based All-Digital Analog to Digital Converter for IOT Applications"; 27th Iranian Conference on Electrical Engineering (ICEE 2019); pp. 249-252; IEEE.

(Continued)

*Primary Examiner* — Jean B Jeanglaude
(74) *Attorney, Agent, or Firm* — Andrew D. Fortney; Central California IP Group, P.C.

(57) ABSTRACT

A voltage-to-time converter (VTC) for a time-domain analog-to-digital converter is disclosed, which provides a time-domain analog-to-digital converter (T-ADC) with low power consumption and high precision. By combining the advantages of current-starving technology, current mirror technology, and body biasing technology, compared with the traditional structure, the VTC and T-ADC achieve excellent performance, such as low power consumption, high linearity, wide input dynamic range, and strong anti-interference to PVT variations. Compared with the traditional voltage-to-time converter, the disclosed voltage-to-time converter has a wider input dynamic range and higher linearity. The input voltage is connected to transistors in the circuit as a body bias, resulting in a very small body current, and no apparent increase in power consumption. The design of a low-power voltage-to-time converter is realized.

1 Claim, 4 Drawing Sheets

(56) References Cited

U.S. PATENT DOCUMENTS

| | | | | |
|---|---|---|---|---|
| 2010/0231430 A1* | 9/2010 | Nakajima | ............. | H03M 1/205 330/253 |
| 2011/0215959 A1* | 9/2011 | Matsuzawa | .......... | H03K 5/2481 327/64 |
| 2014/0176356 A1* | 6/2014 | Li | ........................ | H03K 5/2481 330/254 |
| 2014/0232580 A1* | 8/2014 | Gutta | ..................... | H03M 1/66 327/109 |

OTHER PUBLICATIONS

Takamoto WATANABE et al.; "An All-Digital A/D Converter TAD with 4-Shift-Clock Construction for Sensor Interface in 0.65-μm CMOS"; Proceedings of ESSCIRC, 2010; pp. 178-181; IEEE.

\* cited by examiner

VOLTAGE-TO-TIME CONVERTER ARCHITECTURE FOR TIME-DOMAIN ANALOG-TO-DIGITAL CONVERTER

CROSS REFERENCE TO RELATED APPLICATION(S)

This application claims the benefit of Chinese Patent Application No. 202110472625.8, filed on Apr. 29, 2021, incorporated herein by reference as if fully set forth herein.

TECHNICAL FIELD

This invention concerns a time-domain analog-to-digital converter (T-ADC) and a design method of a voltage-to-time converter (VTC) with high linearity and wide input dynamic range.

BACKGROUND

With the increasing development of semiconductor process technology, nanometer-sized the transistors are continuously scaling, and the power supply voltage is decreasing, thus leading to a new challenge to the development of conventional voltage-domain analog-to-digital converters (ADCs). The power supply voltage in advanced processes can be below 1V, thereby reducing the input and output voltage swing of pure analog circuits, but non-ideal factors such as thermal noise and transistor threshold voltages cannot be reduced in equal proportion, which leads to the attenuation of signal-to-noise ratio (SNR), linearity and other significant indicators of the circuit, causing a negative effect on the performance of traditional voltage-domain ADCs. Compared with voltage-domain ADCs, time domain signal processing can take full use of the advantages of process scaling. With the advancement of CMOS technology, the propagation delay of the circuit is also continuously decreasing, which leads to the improvement of time resolution. Time-domain ADCs generally have two modules: a voltage-to-time converter (VTC), and a time-to-digital converter (TDC). However, the critical units of the VTC are susceptible to non-ideal factors, such as transistor mismatch, noise capacitance, clock skew, and clock jitter, making it difficult to achieve a linear voltage delay response, which affects the dynamic performance of the overall ADC circuit.

The performance of the VTC is mainly limited by two shortcomings. The first is the nonlinear relationship between input analog voltage and output delay (i.e., the voltage delay response). It can directly cause a conversion error from the input voltage to the output digital code, which is determined by the saturation current formula of the transistor, and the nonlinearity increases with an increase in the input voltage. The second is that the dynamic range of the input signal is limited, and a rail-to-rail input range cannot be achieved. At present, the VTC typically includes a simple inverter with a current-starving NMOS transistor, and the input voltage is connected to the corresponding gate of the current-starving NMOS transistor, which means that the input voltage must be larger than the threshold voltage of the transistor to generate the signal path from output to ground. A voltage-to-time converter has been proposed [T. Watanabe and T. Terasawa, An all-digital A/D converter TAD with 4-shift-clock construction for sensor interface in 0.65-μm CMOS [C], 2010 Proceedings of ESSCIRC, 2010, 178-181.] that uses the input voltage as the supply voltage of the standard inverter to successfully implement the V/T conversion process, but the linear input range is only 200 mV, which cannot meet one or more application requirements of the ADCs.

To extend the linear range of VTC, one article [N. Samimian, M. Mousazadeh and A. Khoie, A Time-based All-Digital Analog to Digital converter for IoT Applications [C]. Iranian Conference on Electrical Engineering (ICEE), 2019, 249-252.] discloses that the use of current starving technology and current mirror technology can greatly improve the performance indexes of time-domain analog-to-digital converters and greatly expand the dynamic input range of the circuit. Due to the quadratic relationship between the drain current of the transistor and the gate-source voltage ($V_{GS}$), the circuit still cannot achieve the design goal of a rail-to-rail dynamic input range.

INVENTION SUMMARY

This invention combines the advantages of current starving technology, current mirror technology, and body biasing technology to design a voltage-to-time converter (VTC), and realizes excellent characteristics such as an extremely wide rail-to-rail dynamic input range and a highly linear voltage delay response.

Based on the body-to-source voltage generated by the body biasing technique, the drain current of the starved transistor is highly linear in this invention. Therefore, the technical solution of the invention is a voltage-to-time converter for a time-domain analog-to-digital converter, and the circuit structure of the voltage-to-time converter includes: a PMOS transistor M1 and an NMOS transistor M2, a current mirror comprising a current starving NMOS transistor M3 and an NMOS transistor M5, an NMOS transistor M4 with a fixed bias, an NMOS transistor M6 with a first body bias input, a PMOS transistor M7 with a second body bias input, and a capacitance C.

The source of M1 is connected with a voltage $V_{DD}$, the drain of M1 is connected with the drain of M2 and capacitance C, the connected drains of M1 and M2 provides an output voltage Vout, and the gate of M1 is connected with the gate of M2, both of which receive a clock signal Clk. The source of M2 is connected to the drains of M3 and M4, the sources of M3 and M4 are connected to a ground potential, the gate of M4 is connected to the voltage $V_{DD}$, the gate of M3 is connected to the gate of M5, the drain of M5 and the source of M6, the source of M5 is connected to the ground potential, the drain of M6 is connected to the drain of M7, the gate of M6 is connected to the gate of M7, and the first body bias input receives an input voltage $V_{in}$. The drains of M6 and M7 receive the clock signal Clk. The source of M7 is connected with the voltage $V_{DD}$. The second body bias input of M7 receives both the input voltage $V_{in}$ and the voltage $V_{DD}$.

Transistors M1 and M2 constitute a basic inverter structure, which is a source of the delay in the digital circuit. The voltage-to-delay characteristic of high linearity is realized by controlling the drain current of transistor M3. When the gate-to-source voltage of M3 ($V_{GS3}$) is lower than the threshold voltage ($V_{TH}$) of M3, M3 turns off, and the inverter branch does not work in the absence of another source of current. However, even if $V_{GS3}$ is less than $V_{TH}$, the circuit still operates by adding the M4 transistor with a fixed DC bias. The input voltage swing (e.g., of the M1-M2 inverter) is increased, so that the circuit can eliminate the limit of the threshold voltage on the operation of the NMOS transistor (e.g., M3). There is a quadratic nonlinear relationship between the drain current and the gate-to-source voltage of the current starving transistor M3, so the input voltage cannot be directly connected to the gate of the current starving transistor M3. Thanks to the current minor technology, the drain current of the inverter branch transistor M3 can be controlled by controlling the drain current of the transistor M5. The analog input voltage $V_{in}$ is used as the body bias of the transistors M6 and M7 to generate a highly linear drain current (e.g., at M5, and thus, at M3), which provides a linear relationship between the drain current and the body-to-source voltage (which represents the input signal) of the transistors M6 and M7. Among them, M6 and M7 are different types of MOS transistors, which realize a complementary (e.g., CMOS) input structure to expand the input voltage range (e.g., at the M1-M2 inverter) to rail-to-rail.

On the one hand, the voltage-to-time converter (VTC) disclosed herein has a wider input dynamic range and higher linearity than traditional voltage-to-time converters. On the other hand, the input voltage is input into the circuit as the body voltage of the transistor, and the quiescent current at the body terminal is very small, which does not significantly increase the power consumption, realizing the design of a low-power voltage-time converter.

EXAMPLES

The invention is characterized in that the input voltage is used as the body terminal or body bias voltage of a PMOS transistor and an NMOS transistor in a current-controlling branch of a current mirror at the same time, thereby generating a high-linearity drain current of an inverter receiving the controlled or mirrored current. The specific working principle of this circuit is as follows.

Figure 1:
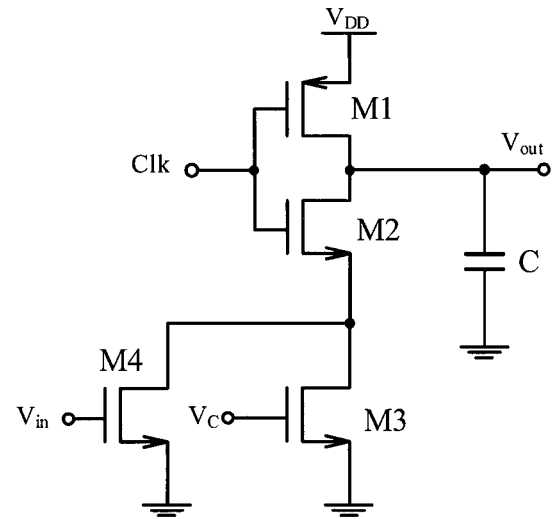
FIG. 1 shows a traditional architecture of a voltage-to-time converter.

Transistors M1 and M2 consist of an inverter. The input terminal of the inverter receives the clock signal Clk. The output terminal outputs the output signal $V_{out}$. The transistor M3 is used as a current starving transistor and create a discharge path for the output of inverter circuit to ground. The relationship between the drain current of the branch where M3 is located and the delay time ($T_d$) of the inverter can be simply expressed as:

$$T_d \propto \frac{C_L}{I_{cp}V_{DD}}$$

Where $C_L$ is the output load capacitance of the inverter, $I_{cp}$ is the drain current of the inverter branch, and $V_{DD}$ is the supply voltage. It can be seen from the above formula that the delay can be controlled by changing the load capacitance, the inverter drain current, and the supply voltage to the inverter. In FIG. 1, the control voltage is directly connected to the gate of the current starving transistor. The structure is simple, and the operation is convenient, but its input voltage to delay characteristic is highly non-linear. The formula of the drain current of the M3 transistor is:

$$I_{D3} = \frac{1}{2}\mu_n C_{ox} \frac{W_3}{L_3}(V_{GS3} - V_T)^2(1 + \lambda_3 V_{DS3})$$

It can be seen that there is a quadratic nonlinear relationship between the drain current and the gate-to-source voltage. Using the input voltage as the gate voltage (e.g., to M4 as shown in FIG. 1) cannot guarantee the linearity of the VTC. Besides, the current starving transistor M3 is an NMOS transistor. When the gate-to-source voltage is less than its threshold voltage, M3 turns off and the inverter cannot work. Therefore, the present invention (FIG. 2) added the pull-down NMOS transistor M4, and the gate voltage of M4 receives a fixed bias (e.g., the supply voltage), so that it can eliminate the limitation of the threshold voltage on the NMOS transistor and adjust the gain and linearity of the delay circuit. Even if the input voltage $V_{in}$ is lower than the threshold voltage of the NMOS transistor M3, the inverter still operates. To solve the problem of non-linearity, the transistor M5 is added to form a current mirror with M3. The drain current of transistor M5 is expressed as $$I_{D5} = \frac{1}{2}\mu_1 C_{ox} \frac{W_5}{L_5}(V_{GS5} - V_T)^2(1 + \lambda_5 V_{DS5})$$

Since $V_{GS3} = V_{GS5}$, $\lambda_3$ and $\lambda_5$ are both equal to 0 when ignoring the channel length modulation effect, therefore $$\frac{I_{D5}}{I_{D3}} = \frac{W_5/L_5}{W_3/L_3}$$

There is a proportional relationship between the leakage current of M5 and the leakage current of M3. The present invention can complete the adjustment of the leakage current of the M3 branch by controlling the current of the M5 branch. How to make the M5 branch produce a high-linearity leakage current becomes the key to the design. The invention adopts body bias technology to realize the control of the voltage to the delay of the circuit. This circuit connects the input voltage to the bodies of the transistors M6 and M7, instead of the gate of M3. The body-to-source voltage on the transistors M6 and M7 generates a highly linear drain current at transistor M5 branch, and thus, at transistor M3 branch. The threshold voltage $V_T$ is a function of the body-to-source voltage (which represents the input signal), and its expression is as follows:

$$V_T = V_{T0} + \gamma(\sqrt{|2\Phi_f - V_{BS}|} - \sqrt{|-|2\Phi_f|})$$

where $V_{T0}$ is the threshold voltage without a body bias, $\gamma$ is the body effect factor, $V_{BS}$ is the body-to-source voltage, and $\phi_f$ is the Fermi potential. The current-starving transistor M3 creates a path for the output of inverter to ground (e.g., when the clock signal turns on the NMOS transistor M2), and the transistor M3 discharges the output load capacitance C to ground. It is easy to know that the fall time of the output delay is determined by the following formula:

$$dt = C \frac{dV}{I_D}$$

Where C is the parasitic capacitance of the output terminal, dV is the voltage change of the output terminal during the discharge of the voltage from logic high to logic low, and dt is the output delay of the fall time. The body bias applied to transistors M6 and M7 provides a linear relationship between the drain current of the current-starving transistor (that is, the discharge current of the load capacitance) and the body-to-source voltage (which represents the input voltage). The threshold voltage formula can be sorted into the following form:

$$V_T = V_{T0} - \gamma \sqrt{|2\phi_f|} + \gamma(\sqrt{|2\phi_f|})\left(\sqrt{1 - \frac{V_{BS}}{2\phi_f}}\right)$$

The Taylor series expansion of the above formula is $$V_T = V_{T0} - \gamma \sqrt{|2\phi_f|} + \gamma(\sqrt{|2\phi_f|})\left(1 - \frac{V_{BS}}{2|2\phi_f|}\right)$$
$$= V_{T0} - \left(\frac{\gamma}{2\sqrt{|2\phi_f|}}\right)V_{BS}$$

Then $$V_T^2 = V_{T0}^2 - \left(\frac{V_{T0}\gamma}{\sqrt{|2\phi_f|}}\right)V_{BS}$$

Neglecting the channel length modulation effect, the leakage current formula of the transistor is $$I_D = \frac{1}{2}\mu_n C_{ox} \frac{W}{L}(V_{GS} - V_T)^2$$
$$= \frac{1}{2}\mu_n C_{ox} \frac{W}{L}(V_{GS}^2 + V_T^2 - 2V_{GS}V_T)$$

Substituting the expressions of $V_T$ and $VT^2$ into the leakage current equation, assuming $\mu_n C_{ox}/2=K$, we can deduce $$I_D = K\left(V_{GS}^2 + V_{T0}^2 - \left(\frac{V_{T0}\gamma}{\sqrt{|2\phi_f|}}\right)V_{BS} - 2V_{GS}\left(V_{T0} - \left(\frac{\gamma}{2\sqrt{|2\phi_f|}}\right)V_{BS}\right)\right)$$

The above formula can be written as follows:

$$I_D \cong \frac{K}{2}(V_{GS} - V_{T0})^2 + \frac{K\gamma}{2\sqrt{|2\phi_f|}}(V_{GS} - V_{T0})V_{BS}$$

Substituting $I_D$ into the delay time expression, then $$dt = C\frac{dV}{I_D} = \frac{CdV}{\frac{K}{2}(V_{GS} - V_{T0})^2 + \frac{K\gamma}{2\sqrt{|2\phi_f|}}(V_{GS} - V_{T0})V_{BS}}$$

Since $V_{GS}$ and $V_{T0}$ have nothing to do with the input voltage $V_B$, the above equation can be simplified to make $$K_1 = \frac{K}{2}(V_{GS} - V_{T0})^2$$
$$K_2 = \frac{K\gamma}{2\sqrt{|2\phi_f|}}(V_{GS} - V_{T0})$$

Therefore, the delay expression is $$dt = \frac{CdV}{K_1 + K_2 V_{BS}} = \frac{K_1 CdV}{K_1^2 - K_2^2 V_{BS}^2} - \frac{V_{BS} K_2 CdV}{K_1^2 - K_2^2 V_{BS}^2}$$

When $V_{BS}$ is relatively small, $V_{BS}$ is dominant over $V_{BS}^2$ on the dt. The expression of delay time (dt) can then be simplified or approximated to dt=a-b$V_{BS}$, where a and b are both constants. The fall time delay of the output signal (i.e., the discharge time) thus has a linear relationship with the input voltage of the body terminal (e.g., when $V_{BS}$ is relatively small). To obtain a balanced inverter, it is necessary to ensure that the rise time and fall time are equal or substantially equal. The input voltage is thus simultaneously connected to the body input terminals of the NMOS transistor M6 and the PMOS transistor M7. The width-to-length ratio of both M1 and M2 may be set to 2:1.

The propagation delay time of the inverter is mainly determined by the transition time $t_{PHL}$ from the input logic high level to the output logic low level and the transition time $t_{PLH}$ from the input logic low level to the output logic high level. These two parameters are completely determined by the inverter rise time and fall time. The propagation delay time $t_{PD}$ is numerically equal to the average value of the two parameters $t_{PHL}$ and $t_{PLH}$.

$$t_{PD} = \frac{t_{PHL} + t_{PLH}}{2}$$

Figure 2:
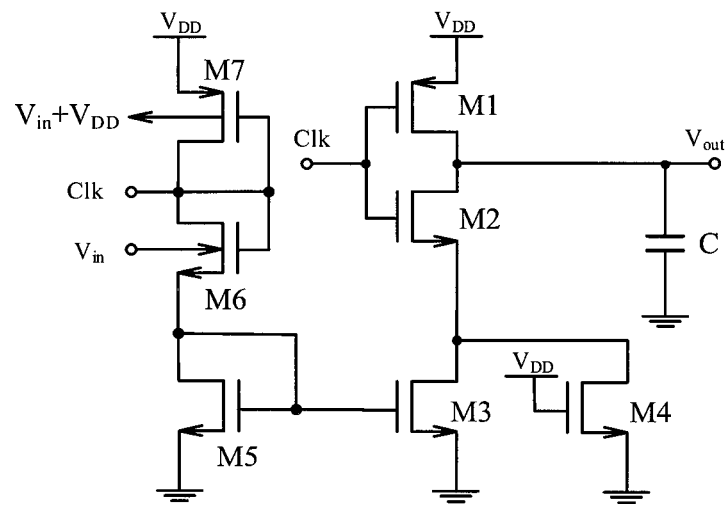
FIG. 2 is a circuit diagram of the voltage-to-time converter of the present invention.
Figure 3:
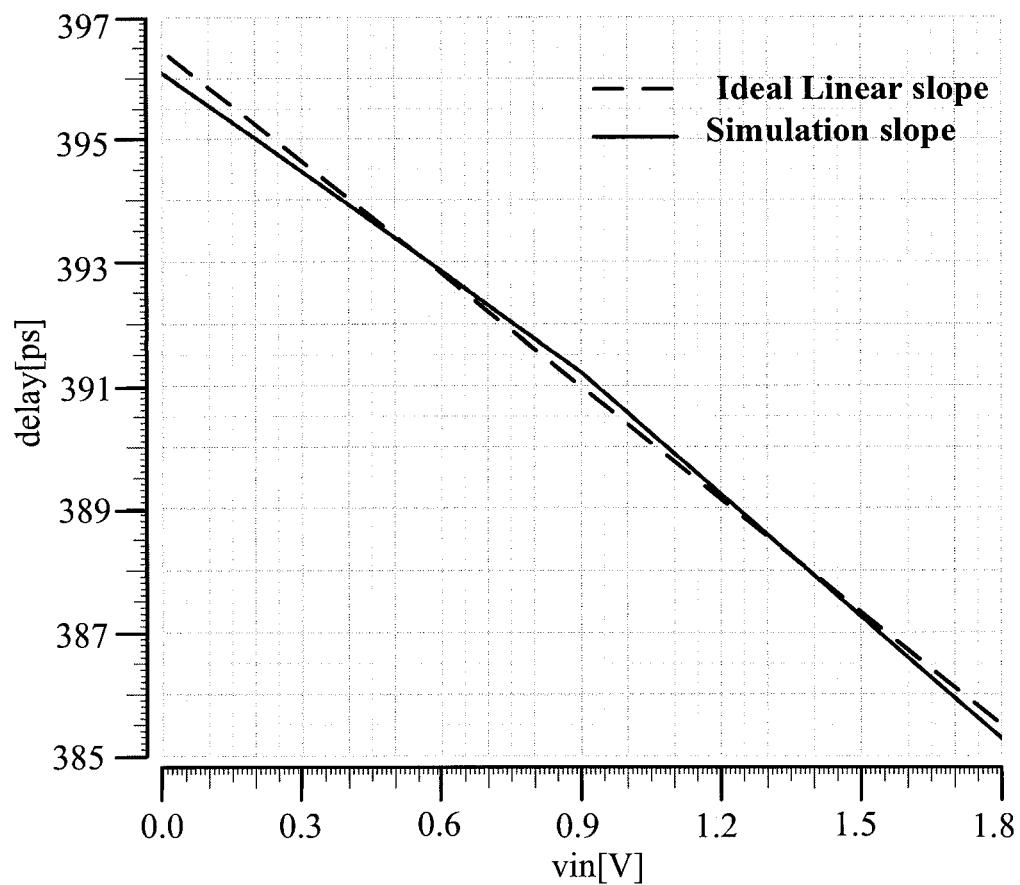
FIG. 3 shows a simulation result of the voltage-delay curve of the invention.
Figure 4:
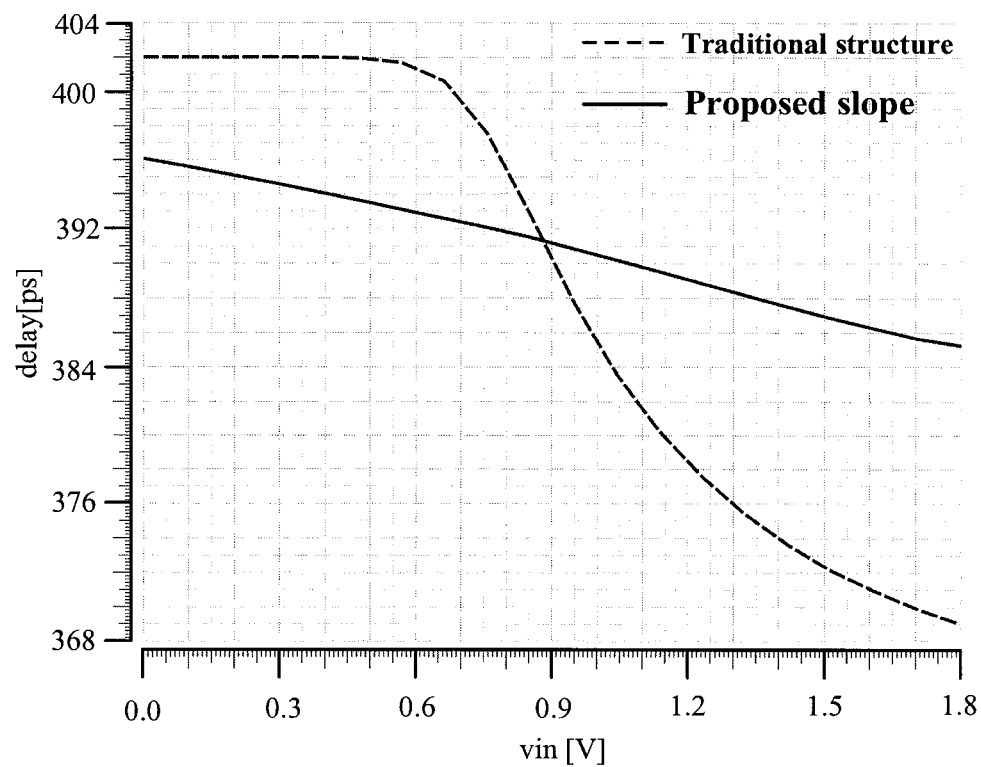
FIG. 4 shows a simulation result of the voltage-delay curve of the conventional VTC and the invention.
Figure 5:
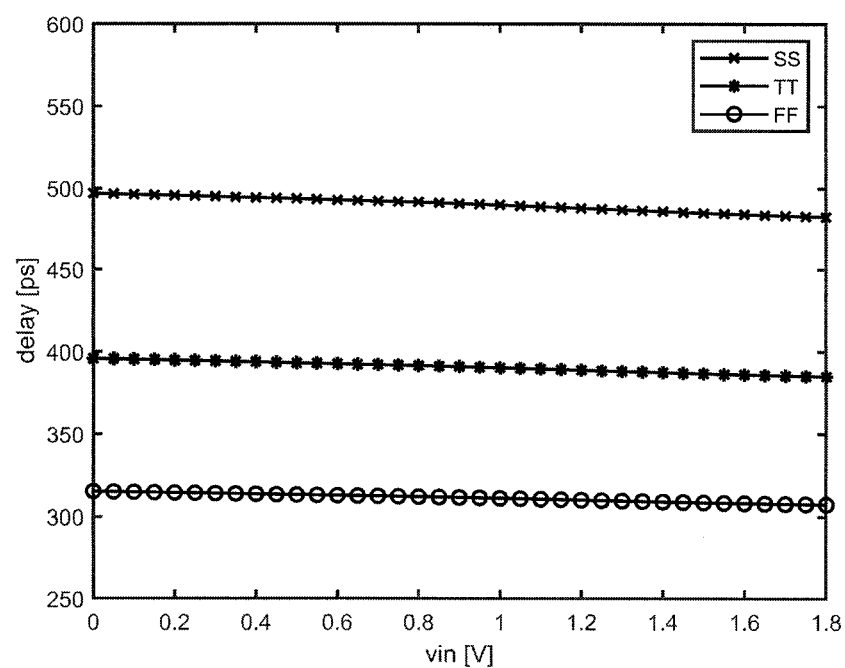
FIG. 5 shows a simulation result of the voltage-delay curve for different process corners of the invention.
Figure 6:
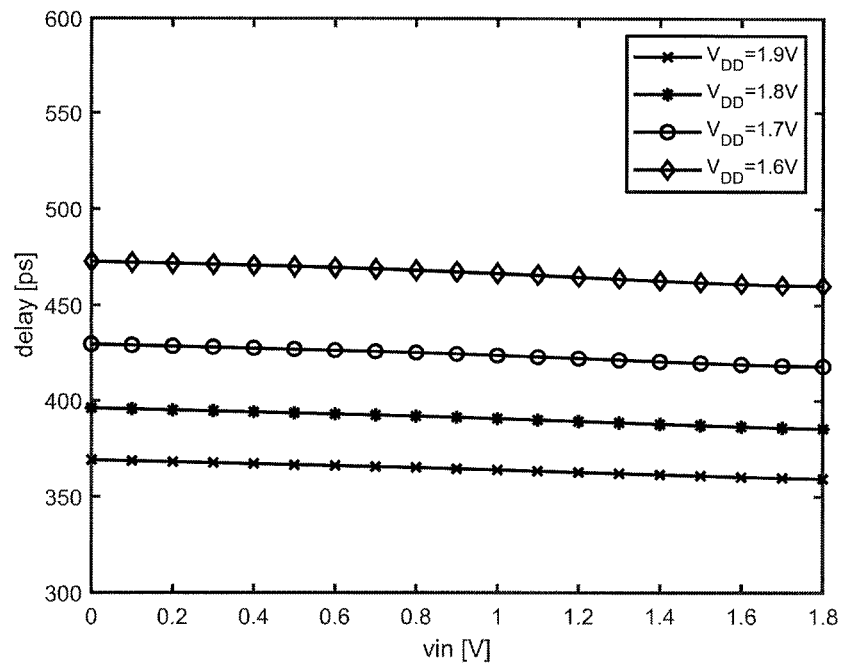
FIG. 6 shows a simulation result of the voltage-delay curve for different supply voltages of the invention.
Figure 7:
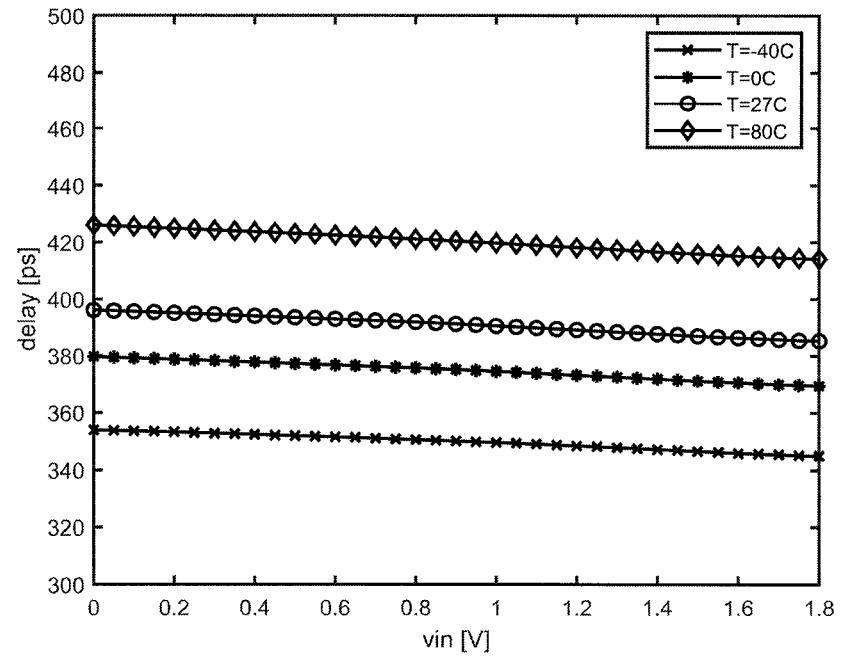
FIG. 7 shows a simulation result of the voltage-delay curve for different temperatures of the invention.

FIG. 1 is a circuit diagram of a conventional voltage-to-time converter, and FIG. 2 is a circuit diagram of the voltage-time converter of the invention. Based on the XFAB 0.18 μm CMOS standard process, the two circuits are simulated in the Cadence VIRTUOSO IC6.1.6 system design platform. When the power supply voltage $V_{DD}$ is 1.8V, the input voltage $V_{in}$ is analyzed by parametric sweep, where the input voltage range is 0~1.8V, and 10 sweeping points in total are sampled. As shown in FIG. 3, the solid line is the simulation result of the voltage-delay curve corresponding to the present voltage-to-time converter, and the dotted line is the ideal linear curve. It can be seen that the maximum offset between the voltage-delay curve of the invention and the ideal linear curve does not exceed ±0.2 ps, and the overall linearity is relatively high. In the rail-to-rail input voltage range, the propagation delay time range is 385 ps~396 ps, the voltage-to-time gain is −6.11 ps/V, and the total power consumption of the VTC is 58.2 nW. To better demonstrate the high linearity characteristics of the present circuit, FIG. 4 is the comparison result of simulating the voltage-delay curves corresponding to the two voltage-to-time converters (VTCs) (the traditional one in FIG. 1 and the present invention in FIG. 2) in the same simulation environment. The solid line is the voltage-delay curve of the circuit of the invention, and the dotted line is the voltage-delay curve of the traditional circuit. It can be seen in FIG. 4 that the present invention has a wider linear input dynamic range, and a better linear characteristic than the traditional circuit. To verify that the circuit of the present invention has a strong ability to resist the interference of process, voltage, and temperature (PVT) variations, the parameter sweep is sequentially performed in the same Cadence tool at different process corners, power supply voltages, and temperatures, adopting the Simple Variable Method. When the power supply voltage is 1.8V and the temperature is 27° C., we perform a parameter sweep of the input voltage at each of the process corners SS (slow-slow), TT (typical-typical), and FF (fast-fast), respectively. The simulation results of the voltage-delay curve over different process corners are shown in FIG. 5. It can be seen that the voltage-delay curve has high linearity under different process corners. When the simulation temperature is 27° C. and the process corner is TT, FIG. 6 shows the voltage-delay curves of a simulation in which the input voltage is swept at power supply voltages of 1.9V, 1.8V, 1.7V, and 1.6V respectively. The change in the power supply voltage didn't affect the linearity of the voltage-delay curves. When the power supply voltage is higher, the delay corresponding to the same input voltage is smaller. When the power supply voltage is fixed at 1.8V and the process corner is TT, a parametric sweep of the input voltage in the simulation was conducted at temperatures of −40° C., 0° C., 27° C. and 80° C., respectively. FIG. 7 shows the corresponding simulation results. It can be seen that the voltage-delay curves have high linearity under different temperature conditions. When the temperature is lower, the delay corresponding to the same input voltage is smaller. The simulation results of FIG. 5, FIG. 6, and FIG. 7 show that the voltage-to-time converter (VTC) of the invention is not sensitive to PVT variations, and has a good performance in maintaining high linearity in different simulation environments.

What is claimed:

1. A voltage-to-time converter structure for a time-domain analog-to-digital converter, comprising: a first PMOS transistor and a first NMOS transistor, a current mirror comprising a current starving NMOS transistor and a second NMOS transistor, a third NMOS transistor with a fixed bias, a fourth NMOS transistor with a first body bias input, a second PMOS transistor with a second body bias input, and a capacitance;

wherein the first PMOS transistor has a source connected with a supply voltage, the first PMOS transistor has a drain connected with a drain of the first NMOS transistor and the capacitance, the connected drains of the first PMOS transistor and the first NMOS transistor provide an output voltage, the first PMOS transistor has a gate connected with a gate of the first NMOS transistor that receive a clock signal; the first NMOS transistor has a source connected to a drain of each of the current starving NMOS transistor and the third NMOS transistor, the current starving NMOS transistor and the third NMOS transistor each have a source connected to a ground potential, the third NMOS transistor has a gate connected to the supply voltage, the current starving NMOS transistor has a gate connected to a gate and a drain of the second NMOS transistor and a source of the fourth NMOS transistor, the second NMOS transistor has a source connected to the ground potential, the fourth NMOS transistor has a drain connected to a drain of the second PMOS transistor, the fourth NMOS transistor has a gate connected to a gate of the second PMOS transistor, the second body bias input receives an input voltage, the drains of the fourth NMOS transistor and the second PMOS transistor receive the clock signal, the second PMOS transistor has a source connected with the supply voltage, and the second body bias input receives both the input voltage and the supply voltage.

* * * * *